United States Patent
Venes et al.

(10) Patent No.: US 7,129,871 B1
(45) Date of Patent: Oct. 31, 2006

(54) DIGITAL-TO-ANALOG CONVERTER WITH PROGRAMMABLE CURRENT CONTROL

(75) Inventors: Arnoldus Venes, Laguna Niguel, CA (US); Yonghua Cong, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/214,798

(22) Filed: Aug. 31, 2005

Related U.S. Application Data

(60) Provisional application No. 60/706,424, filed on Aug. 9, 2005.

(51) Int. Cl.
*H03M 1/00* (2006.01)
(52) U.S. Cl. .................. 341/136; 341/135; 341/144
(58) Field of Classification Search ............. 341/135, 341/136
See application file for complete search history.

(56) References Cited

U.S. PATENT DOCUMENTS 6,518,906 B1 * 2/2003 Abel et al. .................. 341/144
6,621,432 B1 * 9/2003 Ganci .......................... 341/136
2006/0092062 A1 * 5/2006 Pan ............................. 341/144

* cited by examiner

*Primary Examiner*—Rexford Barnie
*Assistant Examiner*—Khai Nguyen
(74) *Attorney, Agent, or Firm*—Sterne, Kessler, Goldstein & Fox P.L.L.C.

(57) ABSTRACT

A wide gain range current digital-to-analog converter (DAC) is presented that includes a unit current cell having a current source module biased by a current source voltage bias, a differential switch module, a main cascode module biased by a first bias voltage and an attenuation cascode module biased by a second bias voltage, configured such that a particular current gain range is obtained at the main cascode module output when a unit current cell current is at or above a current threshold. The output current at the attenuation cascode module output can be input into a current attenuator when the unit current cell current is below the current threshold to obtain additional current gain range. The current attenuator can include a plurality of attenuator cells that can be programmed to a desired level of current gain in linear decibels or linear step intervals. Smaller step sizes can be obtained by programming a current source within the step intervals.

47 Claims, 9 Drawing Sheets

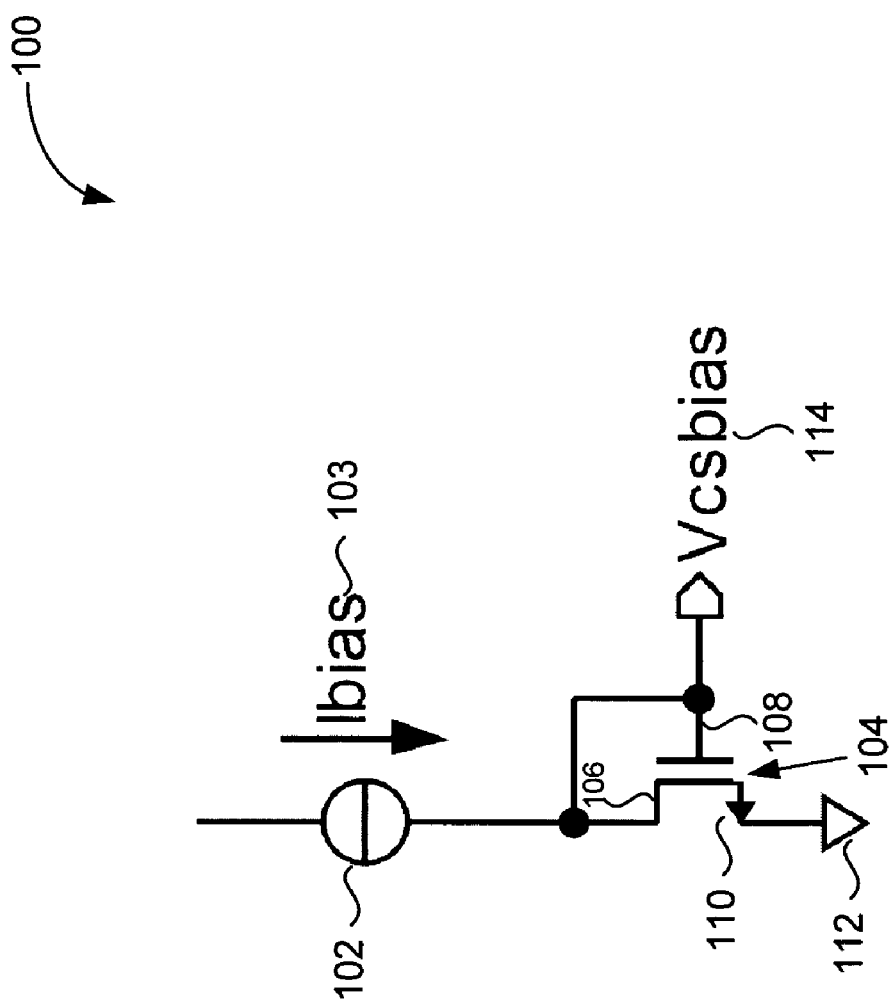
FIG. 1
(CONVENTIONAL)

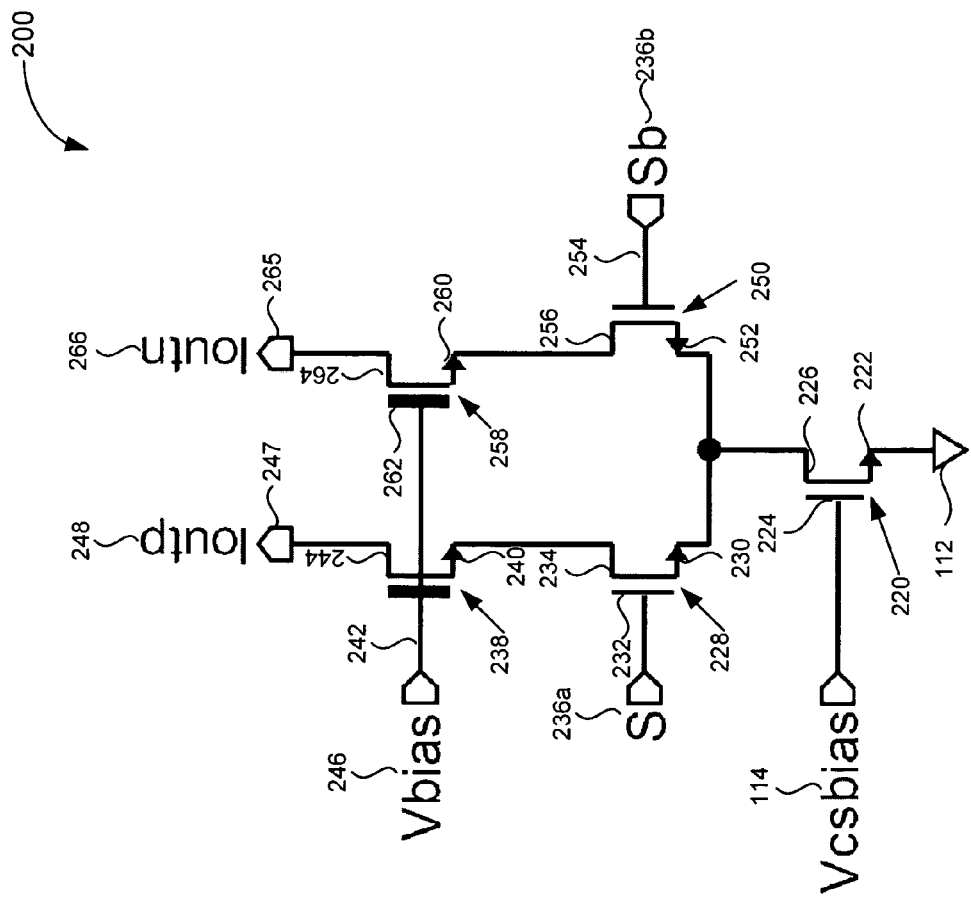
FIG. 2
(CONVENTIONAL)

DIGITAL-TO-ANALOG CONVERTER WITH PROGRAMMABLE CURRENT CONTROL

CROSS-REFERENCE TO RELATED APPLICATIONS

The present application claims the benefit of U.S. Provisional Patent Application 60/706,424, filed on Aug. 9, 2005, which is incorporated by reference herein in its entirety.

BACKGROUND

1. Field

The present invention is related to current digital-to-analog converters (DACs) with programmable output current for use in communication systems.

2. Related Art

Communication systems typically include a current digital-to-analog converter (DAC). In order to adjust system characteristics to channel variations, a programmable output current is normally required. One approach to implement a programmable output current is to vary a bias current entering the DAC. FIG. 1 illustrates a common DAC bias that outputs a current source bias voltage 114 to one or more DAC unit current cells, such as unit current cell 200 shown in FIG. 2. When a DAC bias current 103 is changed, a total output current can change proportionately.

An important performance parameter of the DAC is its linearity. Linearity is a function of the matching of the current source transistors (such as transistor 220 of FIG. 2) in the unit current cells. The matching depends on the size (e.g., width by length) of the current source transistors, as well as the biasing condition (e.g., Vgs-Vt). When DAC bias current 103 is reduced, the bias condition (e.g., Vgs-Vt) of the current source transistors is reduced. This results in a deteriorated current matching of the unit current cells. Thus, the maximum range in which DAC bias current 103 can be varied is limited. In a typical configuration, DAC bias current 103 cannot be varied more than 20–30 decibels (dB) before current source matching can dominate the overall performance of the DAC. This range is insufficient for many communication systems.

Therefore, what is needed is a current DAC with programmable current control such that a DAC current control range is extended.

SUMMARY

A wide gain range current digital-to-analog converter (DAC) is presented. An embodiment includes a differential DAC circuit including a unit current cell having a current source module, a differential switch module, a main cascode module and an attenuation cascode module. The current source module, differential switch module, main cascode module, and attenuation cascode module can be formed from transistors. The current source module is coupled to a current source voltage bias and a ground and provides a unit current cell current that mirrors a current source bias current. The differential switch module is coupled to the current source module. The main cascode module is coupled to the differential switch module and is biased by a first bias voltage. The attenuation cascode module is coupled to the differential switch module and is biased by a second bias voltage. The configuration of the current source module, differential switch module, main cascode module, attenuation cascode module, and bias voltages is such that a particular current gain range is obtained at the main cascode module output. When the unit current cell current is at or above a current threshold, the unit current cell current is routed to a main cascode output to obtain an initial current gain range. When the unit current cell current is below a current threshold, the unit current cell current is routed to an attenuation cascode output and through a current attenuator to obtain additional current gain range. The current attenuator can include a plurality of attenuator cells or groups of attenuator cells that can be programmed to a desired level of current gain in linear decibels or linear step intervals. Smaller step sizes can be obtained by programming a current source within the step intervals.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art(s) to make and use the invention.

FIG. 1 depicts a common DAC bias.

FIG. 2 depicts a conventional DAC unit current cell.

Figure 3:
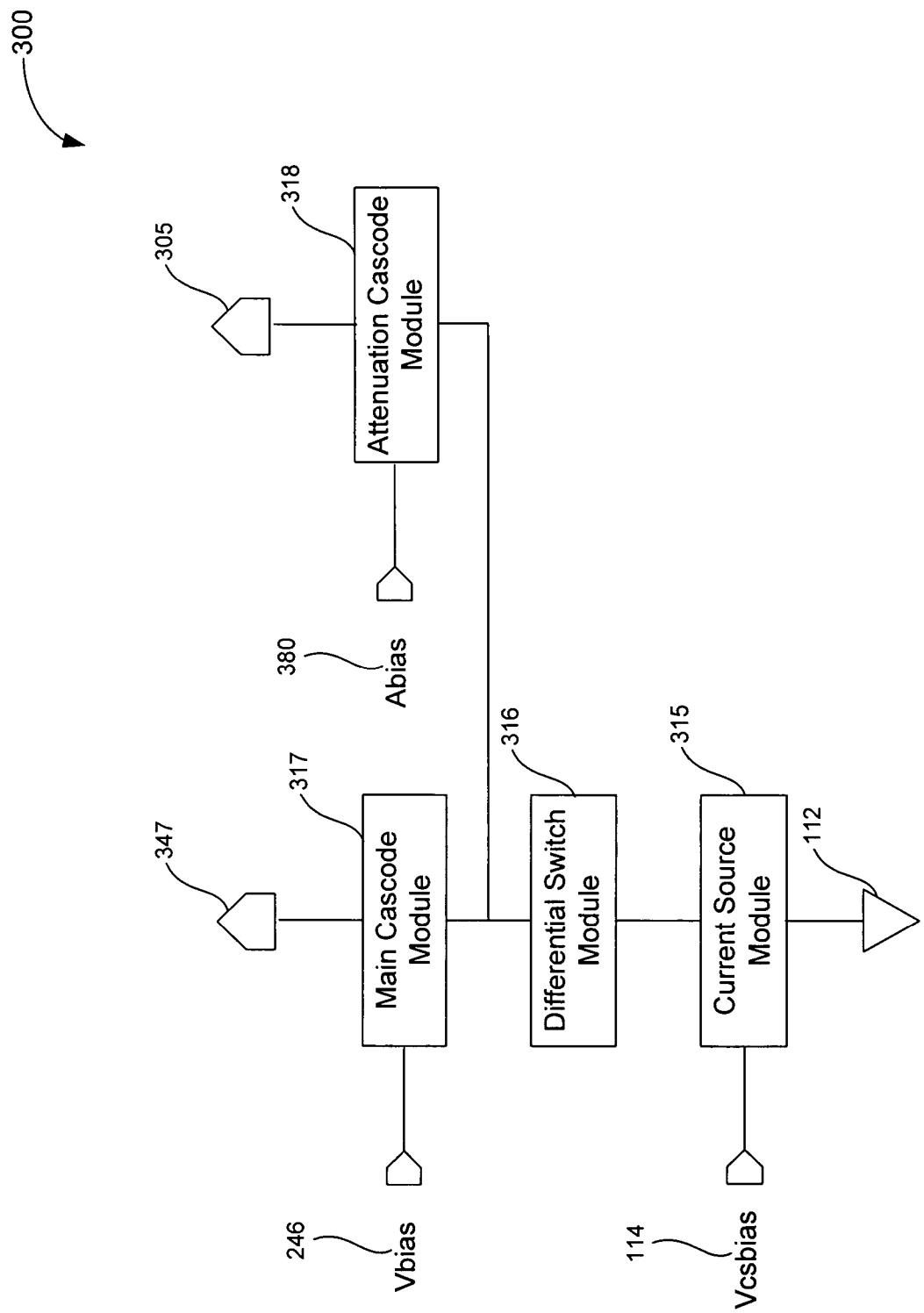
FIG. 3 is a block diagram of a DAC unit current cell, according to an embodiment of the present invention.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

Overview

While specific configurations and arrangements are discussed, it should be understood that this is done for illustrative purposes only. A person skilled in the pertinent art(s) will recognize that other configurations and arrangements can be used without departing from the spirit and scope of the present invention. It will be apparent to a person skilled in the pertinent art(s) that this invention can also be employed in a variety of other applications.

Embodiments of the present invention provide a current DAC with programmable current control such that a maximum range in which a DAC bias current can be varied is increased. This can be accomplished by modifying one or more output cascode transistors of a conventional current DAC and also by including a current attenuator that can be switched into a signal path, or bypassed, depending on a required output current. The current attenuator can be used in conjunction with a variable DAC bias current in order to provide a smaller step size throughout the entire current control range.

Introduction

As stated earlier in the Background section, communication systems, e.g., an upstream burst transmitter in a cable modem, commonly include a current digital-to-analog converter (DAC). A programmable output current is normally required in order to adjust system characteristics to channel variations, for example. One approach to implement a programmable output current can be to vary a bias current entering the DAC. FIG. 1 illustrates a common DAC bias circuit 100 that outputs a current source bias voltage 114. DAC bias circuit 100 includes a transistor 104 and a current source 102 that supplies DAC bias current 103. Transistor 104 has a source 110 coupled to a ground 112, a drain 106 coupled to an output of current source 102, and a gate 108 coupled to drain 106. Current source bias voltage 114 is located at gate 108. Note that although NMOS transistors are shown throughout the figures, other types of transistors can also be used (e.g., PMOS, bipolar, etc.), as would be understood by those skilled in the relevant art(s), without detracting from the scope of the invention.

A current DAC includes an array of unit current cells (e.g., an array of 256 unit current cells). A current DAC can include an array of unit current cells when it is fully segmented, and fractions of these unit current cells for any binary weighted elements. For simplicity of description, a single unit current cell 200 is shown in FIG. 2. Unit current cell 200 includes a current source transistor 220, a switch pair consisting of switch transistors 228 and 250, and a cascode pair consisting of cascode transistors 238 and 258. Unit current cell 200 is shown as a differential circuit. However, a single-ended unit current cell can also be used as would be understood by those skilled in the relevant art(s).

Current source transistor 220 includes a source 222 coupled to ground 112, a gate 224 coupled to gate 108 of transistor 104 (of DAC bias circuit 100 shown in FIG. 1), and a drain 226 coupled to a source 230 of switch transistor 228 and a source 252 of switch transistor 250. Switch transistor 228 has a gate 232 coupled to a switch signal 236a and a drain 234 coupled to a source 240 of cascode transistor 238. Switch transistor 250 has a gate 254 coupled to a switch signal 236b and a drain 256 coupled to a source 260 of cascode transistor 258. Cascode transistor 238 has a gate 242 coupled to a bias voltage 246 and a drain 244 providing output current 248 at an output 247. Cascode transistor 258 has a gate 262 coupled to bias voltage 246 and a drain 264 providing output current 266 at an output 265. Current source transistor 220 and switch transistors 228 and 250 can be thin oxide transistors, and cascode transistors 238 and 258 can be thick oxide transistors. The outputs 247/265 providing output currents 248/266 terminate into a high voltage (approximately 2.5 volts or higher) with a signal swing. Therefore, thick oxide cascode transistors 238/258 can protect thin oxide transistors 220/228/250. Alternatively, transistors 220, 228, 250, 238 and 258 can all be thin oxide transistors or can all be thick oxide transistors.

Current transistor 220 can be biased by DAC bias circuit 100 such that the reference current (DAC bias current 103) is mirrored through current transistor 220. The unit current through current transistor 220 will be approximately the same as DAC bias current 103 if current transistor 220 and transistor 104 are scaled one-to-one.

The unit current through current transistor 220 can be routed through switch transistor 228 or 250, depending on the state of switch signals 236a and 236b, and therefore can run through either cascode transistor 238 or 258 (one or the other). The cascode transistors 238/258 allow for a high output impedance for the DAC and protect switch transistors 228/250 and current source transistor 220 from the high voltage swing at the outputs providing output currents 248/266. The outputs 247/265 providing output currents 248/266 are parallel with those of other unit current cells, and they all terminate into a transformer and a resistive load at approximately 2.5 volts or higher.

As stated in the Background section, an important performance parameter of the DAC is its linearity. Linearity is a function of the matching of the current source transistors (such as transistor 220 of FIG. 2) in the unit current cells. The matching depends on the size (e.g., width by length) of the current source transistors, as well as the biasing condition (e.g., Vgs-Vt). When DAC bias current 103 is reduced, the bias condition (e.g., Vgs-Vt) of the current source transistors is reduced. This results in a deteriorated current matching of the unit current cells. Thus, the maximum range in which DAC bias current 103 can be varied is limited. In a typical configuration, DAC bias current 103 cannot be varied more than 20–30 dB before current source matching can dominate the overall performance of the DAC. This range is insufficient for many communication systems.

In an example embodiment, there can be sixty-four (64) unit current cells represented by six (6) bits, and another four (4) bits that can be weighted differently, for a total of ten (10) bits of resolution in the DAC. When programmable DAC bias current 103 is changed through transistor 104, the current through current source transistor 220 (and therefore the total output current 248/266) can change proportionately. This can be done for a range of up to approximately 30 dB. A dynamic range higher than that cannot be obtained because when the DAC bias current 103 is decreased to a very low level, the output impedance and matching of the current mirror (between transistor 104 and current source transistor 220) can deteriorate. The matching of the current mirror (transistors 104/220), and the matching of a unit current cell compared to another unit current cell, is a function of the current. Thus, the more current, the better the matching. However, headroom is also limited in that the programmable DAC bias current 103 cannot be increased too high or problems with saturation of the transistor devices can arise. Therefore, there is an upper bound set by the available headroom, and a lower bound set by the matching of the current sources (through transistor 104 and current source transistor 220).

Extension of Current Control Range

In order to extend a DAC current control range, unit current cells of a conventional current DAC architecture can be modified and, additionally, current attenuators can be used that can be switched into a signal path, or bypassed, depending on the required output current. For example, a range of 30 dB can be obtained in the conventional manner described above, and an extended amount (e.g., another 30 dB) can be obtained from splitting a DAC output current according to embodiments to now be described.

FIG. 3 is a block diagram of a unit current cell of a current DAC, according to an embodiment of the present invention. Unit current cell 300 includes current source module 315 coupled to current source bias voltage 114 and ground 112. Current source module 315 provides a unit current cell current that mirrors a current source bias current that can be provided by a DAC bias such as DAC bias 100 shown in FIG. 1. Unit current cell 300 also includes a differential switch module 316 coupled to current source module 315 for differential switching, if differential circuitry is implemented. Unit current cell 300 further includes a main cascode module 317 coupled to differential switch module 316 and a bias voltage 246, and an attenuation cascode module 318 coupled to differential switch module 316 and a bias voltage 380. When the unit current cell current is at or above a current threshold, the unit current cell current is routed to main cascode module 317 and to main cascode output 347. This results in an initial current gain range. When the unit current cell current is below the current threshold, the unit current cell current is routed to attenuation cascode module 318, to attenuation cascode output 305, and through a current attenuator (not shown). This results in additional current gain range.

Figure 4:
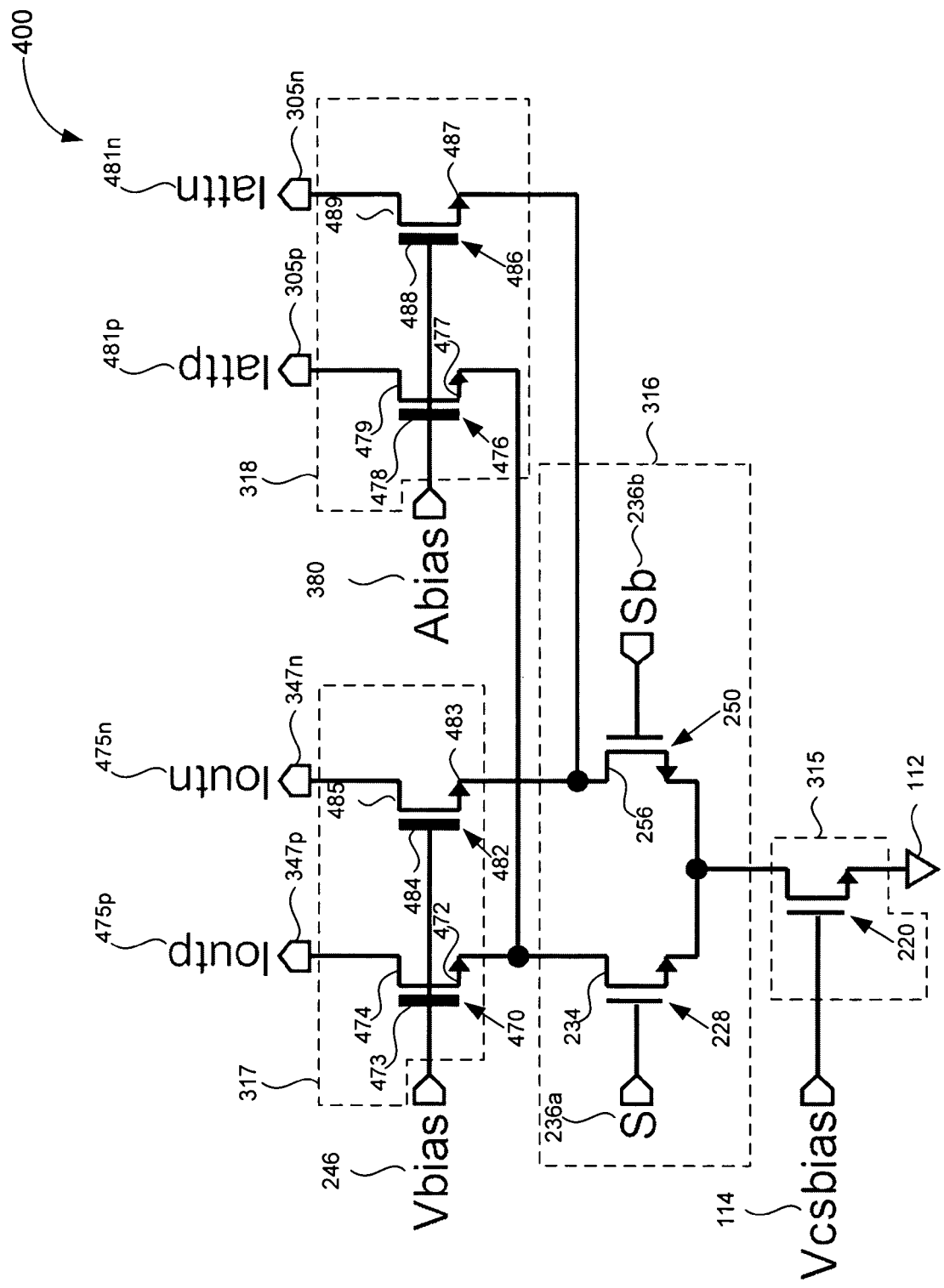
FIG. 4 depicts a DAC unit current cell, according to an embodiment of the present invention.

An embodiment of the present invention includes a current DAC consisting of an array of unit current cells, such as unit current cell 300 of FIG. 3. FIG. 4 depicts an example embodiment of unit current cell 300 in more detail. Unit current cell 400 includes current transistor 220 with current source bias voltage 114 as an input, and switch transistors 228/250 with switch signals 236a/236b as an input, as described above. Cascode transistor 238 of FIG. 2, however, can be modified into cascode transistors 470 and 476. Cascode transistor 470 has a source 472 coupled to drain 234 of switch transistor 228, a gate 473 coupled to bias voltage 246, and a drain 474 providing an output current 475p at an output 347p. Cascode transistor 476 has a source 477 coupled to drain 234 of switch transistor 228, a gate 478 coupled to bias voltage 380, and a drain 479 providing an output current 481p at an output 305p. Similarly, cascode transistor 258 of FIG. 2 can be modified into cascode transistors 482 and 486. Cascode transistor 482 has a source 483 coupled to drain 256 of switch transistor 250, a gate 484 coupled to bias voltage 246, and a drain 485 providing an output current 475n at an output 347n. Cascode transistor 486 has a source 487 coupled to drain 256 of switch transistor 250, a gate 488 coupled to bias voltage 380, and a drain 489 providing an output current 481n at an output 305n. Outputs 305p/305n can be coupled to an attenuator (described further below). In one embodiment, cascode transistors 470, 482, 476, and 486 can be thick oxide transistors. In another embodiment, transistors 470, 482, 476, and 486 can be thin oxide transistors.

Cascode transistors 470 and 476 are of differing sizes (i.e., widths), the total combined size being substantially the same as the size (width) of cascode transistor 238 (of FIG. 2). Similarly, cascode transistors 482 and 486 are of differing sizes, the total combined size being substantially the same as the size (width) of cascode transistor 258 (of FIG. 2). For example, cascode transistors 470/482 can each be sized at 80% of the width of cascode transistors 238/258, and cascode transistors 476/486 can then each be sized at 20% of the width of cascode transistors 238/258. The size differences are not to be limited to this percentage breakdown, and can be any breakdown as long as the total areas used by cascode transistors 470 and 476, and by cascode transistors 482 and 486, are substantially the same as the areas used by cascode transistors 238 and 258 (of FIG. 2), respectively.

Additionally, the cascode transistors (in this case, cascode transistors 476/486) that are biased by bias voltage 380 should be of a smaller size than the cascode transistors (in this case, cascode transistors 470/482) that are not biased by bias voltage 380. The size breakdown chosen depends on the range of current that is to be accommodated.

Cascode transistors 470 and 476, for example, can be thought of as a single transistor, but with a portion of that single transistor (represented by cascode transistor 476) biased by bias voltage 380 instead of bias voltage 246. Similarly, cascode transistors 482 and 486 can be thought of as a single transistor, but with a portion of that single transistor (represented by cascode transistor 486) biased by bias voltage 380 instead of bias voltage 246. At any given time, only one of bias voltage 246 and bias voltage 380 is biased to the desired operating condition. In other words, one of the bias voltages 246/380 is pulled to a low voltage (e.g. zero volts), and the other is biased to the desired voltage (e.g., 2 volts). Thus, an output current is switched through either output 347p/347n or output 305p/305n. The sizing of cascode transistors 470/476 and 482/486 is such that when DAC bias current 103 is a high current running through current source transistor 220, bias voltage 380 is disabled, bias voltage 246 is enabled, and output 347p/347n is used to provide output current 475p/475n through the larger cascode transistors 470/482. In the alternative, when DAC bias current 103 is a low current running through current source transistor 220, bias voltage 246 is disabled and bias voltage 380 is enabled, routing the smaller current through cascode transistors 476/486 and providing output current 481p/481n through output 305p/305n. In other words, when DAC bias current 103 is low (i.e., the circuit path is at a high impedance), the current is routed through cascode transistors 476/486 instead of cascode transistors 470/482.

As described above, only one of outputs 347p/347n and 305p/305n is intended to be active at any given time. This is achieved by switching bias voltage 246 and bias voltage 380 between two defined voltages, $V_{high}$ and $V_{low}$. $V_{high}$ should be defined such that a proper DC biasing of unit current cell switch transistors 228/250 is obtained. $V_{low}$ should be defined such that the corresponding cascode transistor is in an 'off' state whenever $V_{low}$ is applied. For example, $V_{low}$ can be defined as zero volts, and $V_{high}$ can be defined as a typical power supply voltage sufficient to turn on transistors 470/482. The voltages used to define $V_{low}$ and $V_{high}$ are not to be limited to these voltages. The values of $V_{low}$ and $V_{high}$ are arbitrary, depending on the implementation.

Usually when there is a high output current (high DAC bias current 103), headroom issues might arise due to a large signal swing in the output. In this situation, anything that is in the signal path will contribute to distortion. By using this modified unit current cell, the current is routed through either output 347p/347n or output 305p/305n. There is nothing in the signal path added when in a high current mode, and the total amount of current continues straight to output 347p/347n. When in low current mode, headroom is not an issue because the signal swing will be small.

A main purpose of this invention is to extend the current control range below a level that can be achieved by reducing bias current 103. When DAC bias current 103 is set to its maximum level, cascode transistors 470/482 are made active. When DAC bias current 103 is reduced to a minimum acceptable level for device matching, cascode transistors 476/486 are made active. Further reduction in DAC output current is accomplished by splitting the output current 481p/481n in an attenuator, which will now be discussed. Fine control of DAC bias current 103 will also be discussed.

Figure 5:
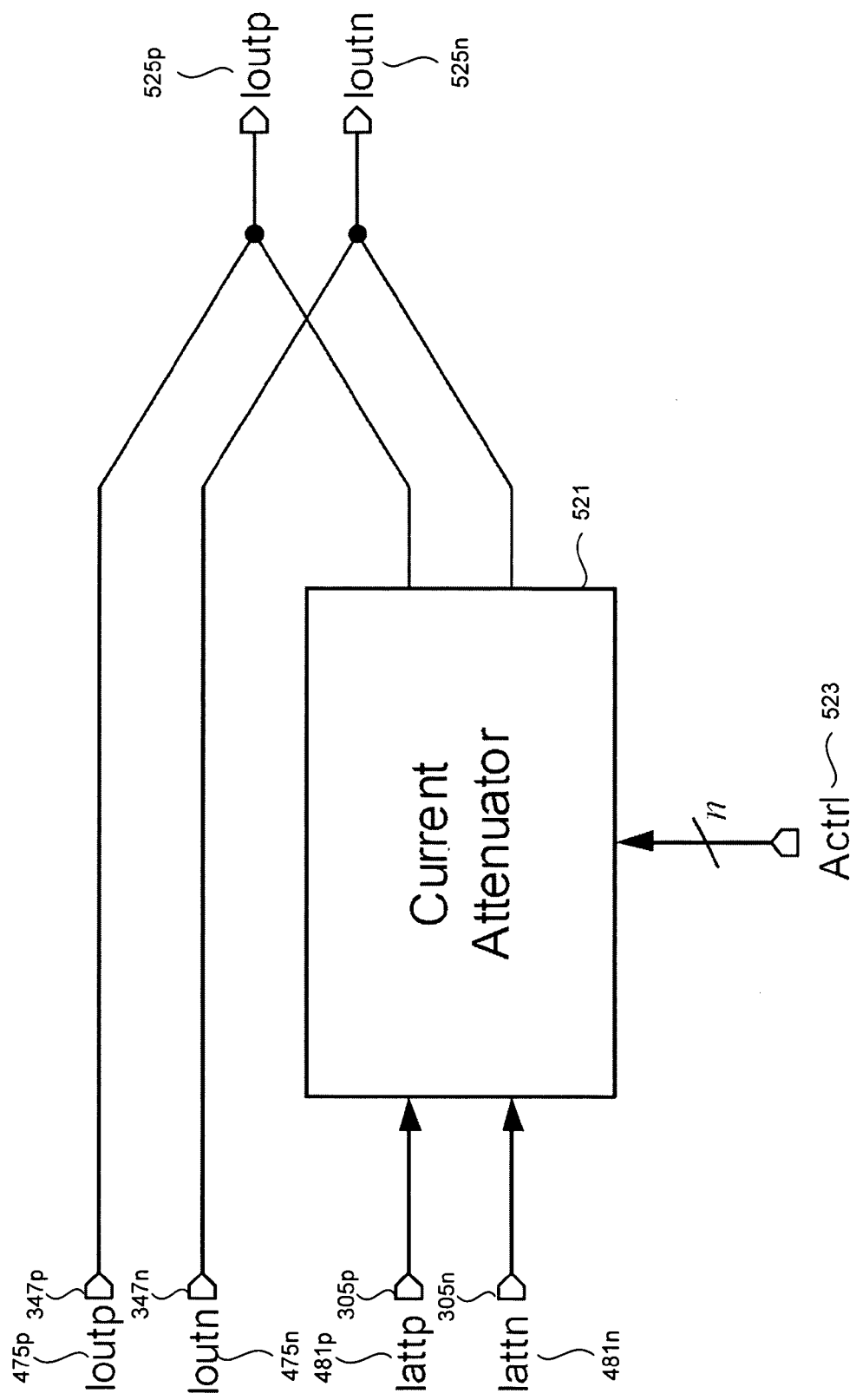
FIG. 5 shows the addition of a current splitting attenuator in a DAC signal path, according to an embodiment of the present invention.

FIG. 5 illustrates the implementation of a current attenuator 521 within an output signal path of the DAC. The output signal paths are those output from unit current cells as described above with reference to FIG. 4. In FIG. 5, if DAC bias current 103 is a high current, and switch signals 236a/236b and bias voltages 246 and 380 are biased such that output 347p/347n carries the unit current cell output current, then current attenuator 521 would be bypassed. In this case, if output 347p/347n carries the unit current cell output current, then a system output current 525p/525n is equal to output current 475p/475n. In other words, for higher output current levels, the output currents of the DAC are directly routed to the output of the system. In this state, current attenuator 521 represents a high impedance output ('tri-state') and will not have a significant impact on the large signal performance of the DAC.

If, instead, DAC bias current 103 is a low current, and switch signals 236a/236b and bias voltages 246 and 380 are biased such that output 305p/305n carries the unit current cell output current, then that unit current cell output current signal would be received by current attenuator 521. In this case, if output 305p/305n carries the unit current cell output current, then the system output current 525p/525n is equal to output current 481p/481n as altered by current attenuator 521. In other words, for lower output current levels, the output current of the system is provided through the current attenuator.

Current attenuator 521 can be programmable through a control signal 523. For example, control signal 523 can be implemented as a 5-bit control signal and represent a 30 dB current gain range, as described in more detail below. Control signal 523 is not to be limited to this, however. Other control signal lengths and gain ranges can be implemented without straying from the scope of the invention.

One purpose of using current attenuator 521 is to obtain lower and lower current values. The bias current can be lowered for a first gain range (e.g., 30 dB) while using a main signal path. Once the bias current is at a lowest acceptable level, the current signal path is switched to an attenuator signal path for further current reduction (e.g., another 30 dB of range). The smaller devices in the attenuator signal path carry less current output relative to the larger devices in the main signal path.

Figure 6:
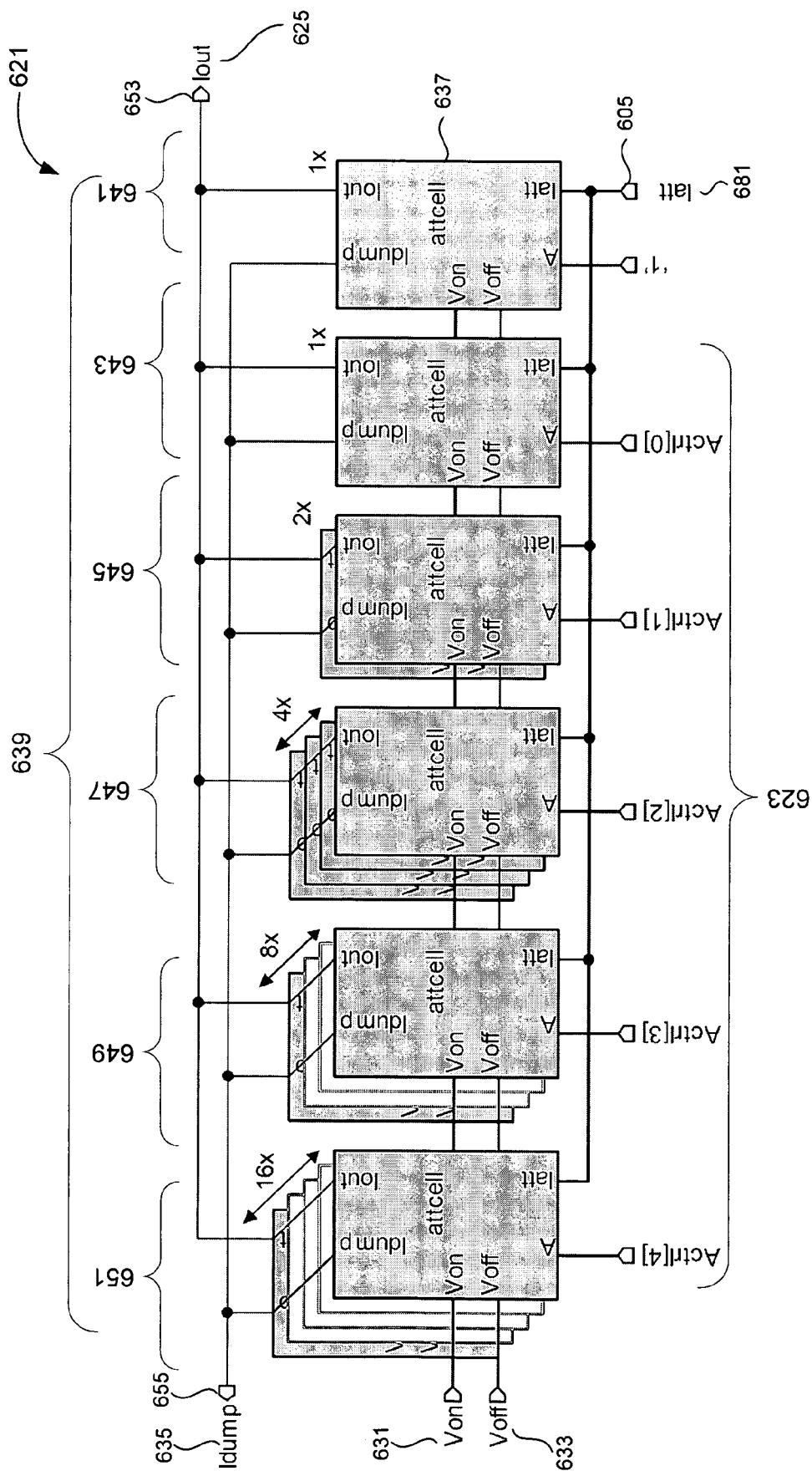
FIG. 6 depicts a current splitting attenuator as a plurality of attenuator cells, according to an embodiment of the present invention.

In an embodiment, current attenuator 521 can include a plurality of attenuator cells, such as attenuator cells 637 shown in current attenuator 621 in FIG. 6. FIG. 6 depicts current attenuator 621 as a single-ended implementation for simplicity of description, however another similar circuit can be used for complementary input/output signals. Current attenuator 621 can be organized as a plurality of attenuator subgroups 641, 643, 645, 647, 649, and 651 situated as a cascading array 639. In the particular embodiment shown, attenuator subgroups 641 and 643 each include one attenuator cell 637, attenuator subgroup 645 includes two attenuator cells 637, attenuator subgroup 647 includes four attenuator cells 637, attenuator subgroup 649 includes eight attenuator cells 637, and attenuator subgroup 651 includes sixteen attenuator cells 637. This grouping represents a binary weighting of system output current 625 as a function of control signal 623.

Each attenuator cell 637 of current attenuator 621 receives as an input, input current 681, bias voltage Von 631, bias voltage Voff 633, and a control signal bit 'A'. Designated bits of control signal 623 each control a corresponding attenuator subgroup. For the embodiment of current attenuator 621 shown in FIG. 6, control signal 623 is a 5-bit control signal, for example. Thus, each bit of 5-bit control signal 623 controls a corresponding attenuator subgroup for a total of −30 dB current gain in −6 dB attenuation steps. It will be understood by those skilled in the relevant art(s) that any grouping and number of attenuator cells fits within the scope of the invention. Similarly, as stated earlier, other control signal lengths and gain ranges can be implemented.

In the example embodiment in FIG. 6, when control signal 623 is '00000', all attenuator cells route an input current 681 from a unit current cell (e.g., current 481p/481n of unit current cell 400 of FIG. 4) at input 605 to system output 653 as system output current 625. This results in an attenuation of 0 dB. Attenuator subgroup 641, which includes one attenuator cell, is not associated with control signal 623 and remains on to prevent the creation of a high impedance point that would occur if all of the attenuator cells were turned off.

If control signal 623 is changed to '10000', then the attenuator cells associated with attenuator subgroup 651 route $^{16}/_{32}$ (or 50%) of input current 681 to dump output 655 as unneeded dump current 635, which is routed to a power supply (e.g., a 2.5V power supply) (not shown). This results in the other 50% of input current 681 being output as system output current 625, and represents a −6 dB current gain (6 dB attenuation). The attenuation of current can be further increased by setting control signal 623 to '11000'. In this state, attenuator subgroups 651 and 649 route a total of $^{24}/_{32}$ (or 75%) of input current 681 to dump output 655 as dump current 635. This results in the other 25% of input current 681 being output as system output current 625, and represents a −12 dB current gain. Similarly, current gains of −18 dB, −24 dB, and −30 dB can be selected by setting control signal 623 to '11100', '11110', and '11111', respectively.

Figure 7:
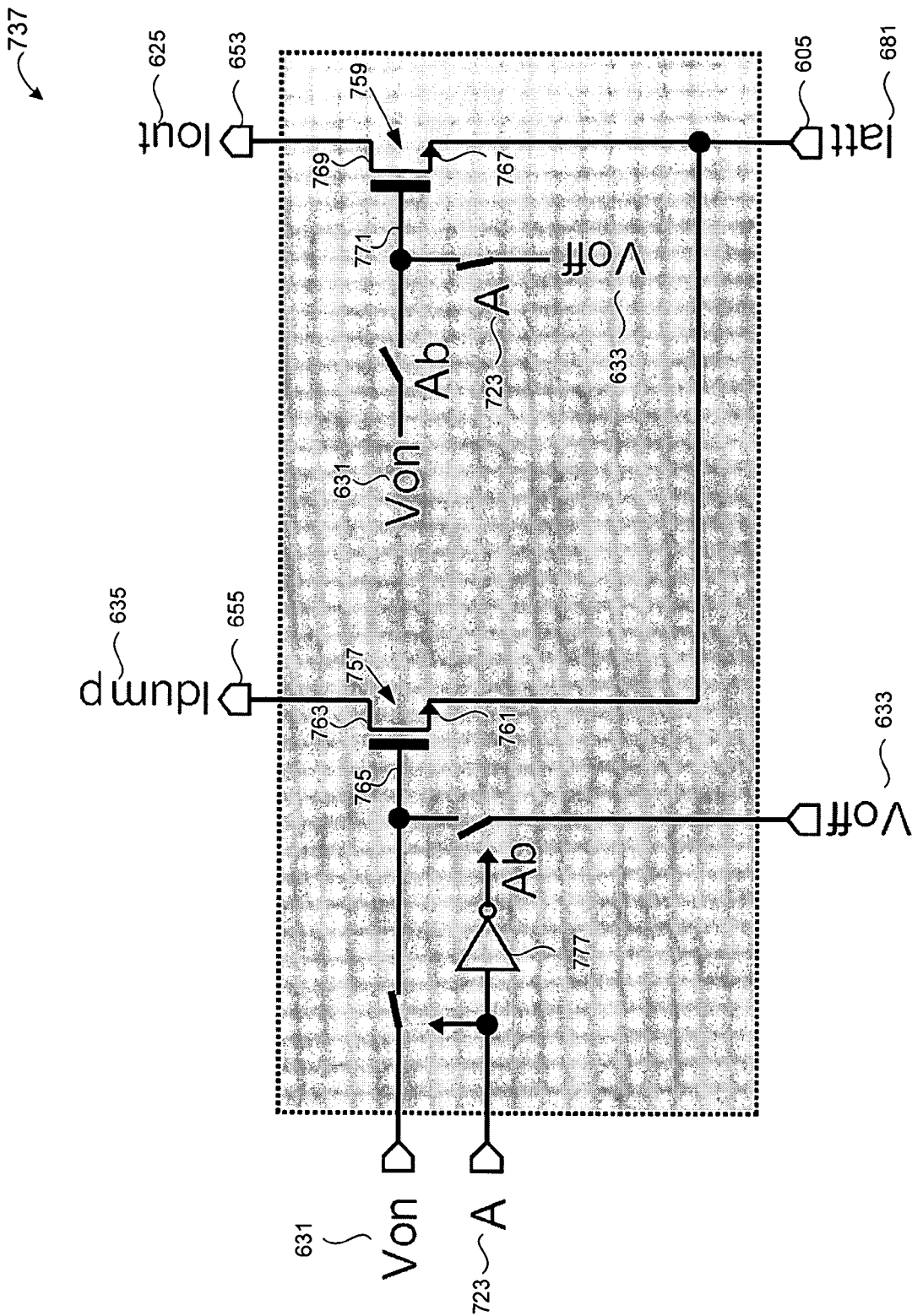
FIG. 7 illustrates an attenuator cell, according to an embodiment of the present invention.

An example embodiment of an attenuator cell 637 is shown in FIG. 7 as attenuator cell 737. Attenuator cell 737 includes attenuator cell transistors 757 and 759. Attenuator cell transistors 757 and 759 can be thick oxide or thin oxide transistors. Attenuator cell transistor 757 includes a source 761 coupled to input 605, which carries input current 681. Attenuator cell transistor 757 also includes a drain 763 coupled to dump output 655, which carries dump current 635. Attenuator cell transistor 757 further includes a gate 765 coupled to either a bias voltage Von 631 or a bias voltage Voff 633, controlled by control signal bit 723 and inverter 777, which together form a voltage bias switch. Control signal bit 723 is a bit from control signal 623 (of FIG. 6), for example. Attenuator cell transistor 759 includes a source 767 coupled to input 605, a drain 769 coupled to system output 653, which carries system output current 625, and a gate 771 coupled to either bias voltage Von 631 or bias voltage Voff 633, controlled by control signal bit 723 and inverter 777. FIG. 7 depicts attenuator cell 737 as a single-ended implementation for simplicity of description, however another similar circuit can be used for complementary input/output signals.

At any given time, only one of attenuator cell transistors 757 and 759 is active. When control signal bit 723 is low (e.g., '0'), attenuator cell transistor 759 is active, and input current 681 is routed to system output 653. Alternatively, when control signal bit 723 is high (e.g., '1'), attenuator cell transistor 757 is active, and input current 681 is routed to dump output 655. Bias voltage Von 631 should be chosen such that bias conditions of all devices in the attenuator cell, as well as the DAC unit current cells, are sufficient to keep the devices in saturation (e.g., Von=2.5V). Bias voltage Voff 633 should be low enough to ensure that its respective attenuator cell transistor 757/759 does not conduct any current when coupled to bias voltage Voff 633 (e.g., Voff=ground).

By controlling the input control signals 723 to each of attenuator cells 737 of a current attenuator 621, for example, each attenuator cell 737 can route the input current 681 to either system output 653 or dump output 655. The embodiment shown and described in reference to FIG. 6 uses thirty-two attenuator cells. (However, this number can be higher or lower depending on the requirements of the attenuator.) When all of input current 681 is flowing through attenuator cell transistor 759 in each of the thirty-two attenuator cells, all of input current 681 passes to system output 653. If it is desired to have, for example, a 50% reduction of system output current 625, then in sixteen of the thirty-two attenuator cells, input current 681 is routed through transistor 757 and dumped at dump output 655. The other sixteen attenuator cells route input current 681 through attenuator cell transistor 759 to system output 653. This effectively results in a 50% split in the output current, which, in this embodiment, provides −6 dB in attenuation. Because bias voltages Von 631, Voff 633, and the bias voltages at input 605, system output 653, and dump output 655 are respectively equal across all thirty-two attenuator cells, input current 681 is split evenly among all thirty-two attenuator cells.

It would be apparent to one skilled in the relevant art(s) that a gain control mechanism can be implemented in various ways without detracting from the scope of this invention. For example, the above-described implementation of current attenuator 621 represents a binary weighted implementation of gain control, resulting in −6 dB attenuation steps. However, current attenuator 621 is not limited to binary weighting of attenuator cells. In alternative embodiments, a current attenuator may be implemented using any number of attenuator cells and any grouping of attenuator cells. For example, instead of using thirty-two attenuator cells, a higher or lower number of attenuator cells can be used depending on the desired attenuation requirements. As another example of an alternative embodiment, the current attenuator can be implemented in a linear manner by switching one attenuator cell out at a time rather than by binary weighting. In this case, the attenuation would be linear, but the step size in decibels would not be linear. In yet another embodiment, current gain control, in particular the fine current gain control discussed below, does not need to be controlled via incremental steps. For example, it can be implemented using analog control.

As shown by the above description, the combination of changing bias currents in the DAC, bypassing an attenuator in a high-current mode, and routing current through an attenuator in low-current mode, can provide an additional current gain (e.g., −30 dB) in incremental steps (e.g., −6 dB steps). Smaller steps are also attainable, as will now be discussed.

Figure 8:
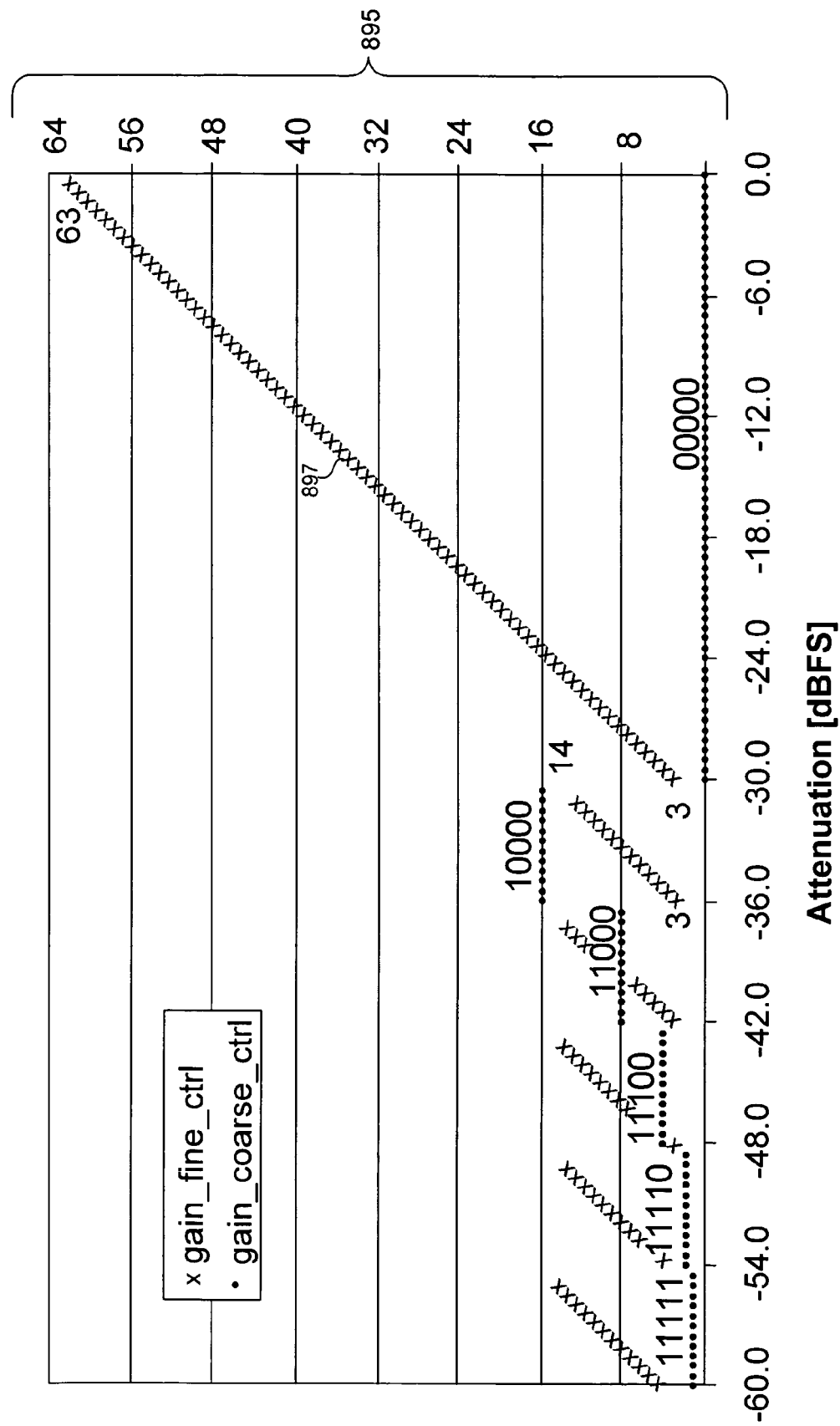
FIG. 8 is a graph showing coarse/fine current gain control, according to an embodiment of the present invention.

A current splitting attenuator, such as current attenuator 621, can provide incremental attenuation steps (e.g., 6 dB steps) in a low end of a gain control range. The current attenuator can be used in conjunction with a variable (or programmable) DAC bias current in order to provide an even smaller step size (e.g., 0.5 dB) throughout the entire current control range. FIG. 8 is a graph showing coarse/fine current gain control, according to an embodiment of the present invention.

FIG. 8 provides an example of 60 dB gain control in 0.5 dB steps. A fine step control is implemented by changing the DAC bias current (e.g., DAC bias current 103) in 0.5 dB steps. This example shows 64 fine settings 895. The maximum output current is defined as 0 dBFS and requires a fine control value of '63'. The range 897 from 0 dBFS down to −30 dBFS is realized by changing the DAC bias current fine control down to a value of '3' with the coarse control (based on control signal 623, for example) at 0 dB current gain (or '00000'). The next step down is found by increasing the DAC bias current fine control to '14' with the coarse control at a current gain level of −6 dB (or '10000'), as described above with reference to FIG. 6. Throughout the remaining coarse attenuator step intervals (e.g., '11000', '11100', '11110', and '11111') also described above with reference to FIG. 6, the DAC bias current fine control is moved between '3' and '14' as a saw tooth shaped control signal. This combination of coarse and fine control realizes a constant gain step in the full 60 dB range.

Figure 9:
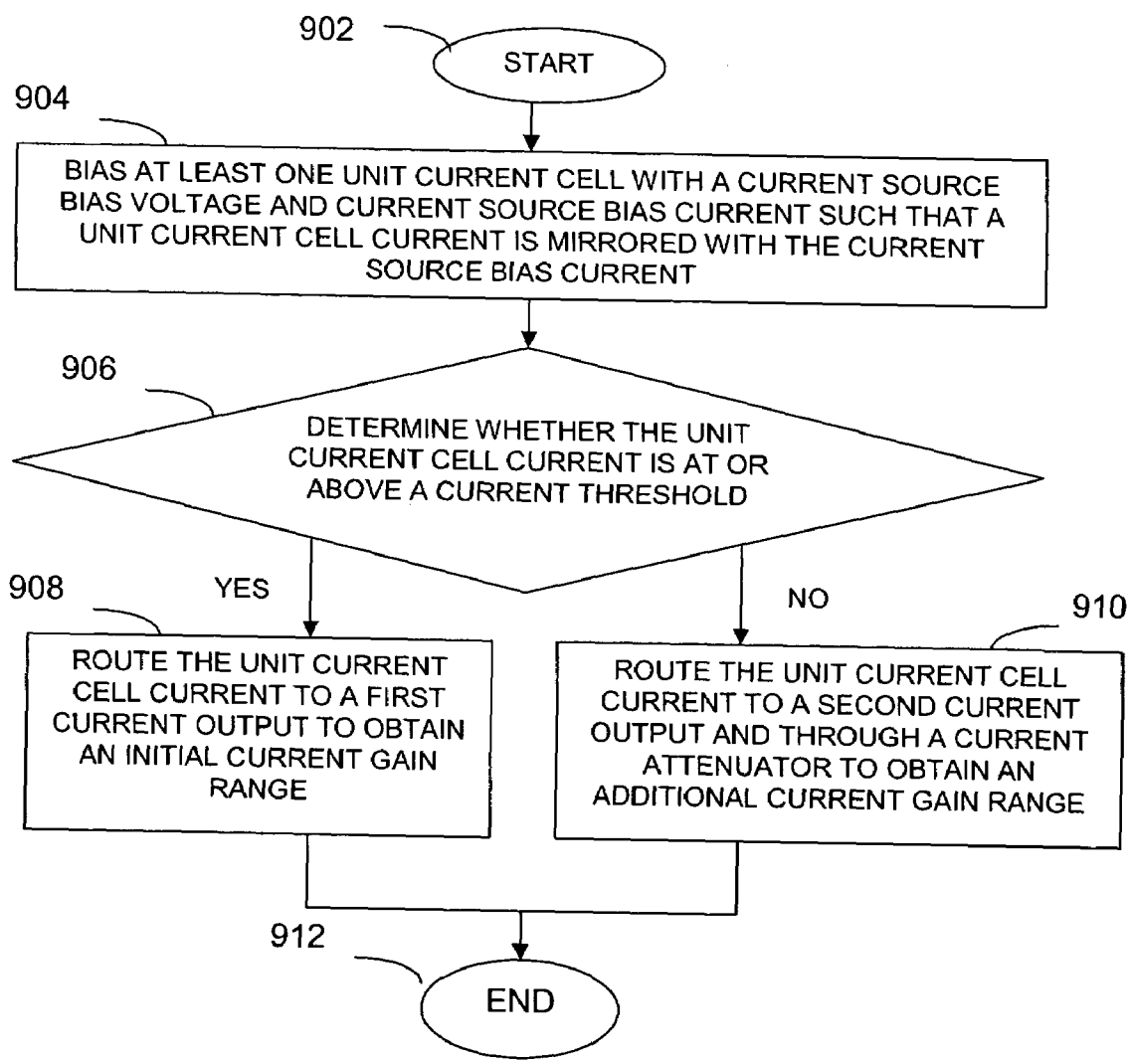
FIG. 9 depicts a method of controlling current gain according to embodiments of the present invention.

A method 900 of controlling current gain according to the above-described embodiments is shown in FIG. 9. Method 900 starts at step 902 and immediately proceeds to step 904. In step 904, at least one unit current cell is biased with a current source bias voltage (such as current source bias voltage 114) and current source bias current (such as DAC bias current 103) such that a unit current cell current is mirrored with the current source bias current. In step 906, it is determined whether the unit current cell current is at or above a current threshold. If the unit current cell current is at or above the current threshold, the method proceeds to step 908 where the unit current is routed to a first current output (such as output 347p/347n) to obtain an initial current gain range. If the unit current cell current is below the current threshold, the method proceeds to step 910 where the unit current cell current is routed to a second current output (such as output 305p/305n) and through a current attenuator (such as current attenuator 621) to obtain an additional current gain range. Method 900 terminates at step 912.

Step 910 can include attenuating the unit current cell current to a desired current gain level. In various embodiments, this can be done in incremental steps by switching attenuator cells (such as shown in FIGS. 6 and 7) on or off, for example. In one embodiment, attenuator cells can be switched on or off individually to provide a linear attenuation (i.e., a linear reduction in current flow). In another embodiment, binary weighted subgroups of attenuator cells can be switched on or off to provide coarse linear incremental current gain steps (in decibels). In a further embodiment, the current source bias current can be changed in small incremental steps within the desired current gain level (e.g., coarse step) to provide current gain control by fine incremental current gain steps that are smaller in size than the coarse steps.

The current attenuator can be programmed for the desired current gain level. This can be done by providing a control signal, for example (such as control signal 623), although other methods of programming a current attenuator would be understood by those skilled in the relevant art(s). In an embodiment, each bit of control signal 623 can be used to control a specific attenuator cell or a specific group of attenuator cells (such as the binary weighted subgroups of attenuator cells as discussed above with reference to FIG. 6). As would be apparent to one skilled in the relevant art(s), control signal bit sequences (or any signal used as an on/off signal) can use '1's to enable and '0's to disable, or they can use '0's to enable and '1's to disable attenuator cells or groups of attenuator cells, depending on the chosen implementation of the circuit.

The current DAC embodiments described above provide a number of advantages. For example, they provide a wide range of current control with virtually no need for additional programmable current or voltage amplifiers or attenuators located after the current DAC. A related advantage is that a smaller chip area can be used for the current DAC. Power efficiency is also optimized such that when an output current is high, there is little to no current wasted.

While various embodiments of the present invention have been described above, it should be understood that they have been presented by way of example only, and not limitation. It will be apparent to persons skilled in the relevant art(s) that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more, but not all exemplary embodiments of the present invention as contemplated by the inventor, and thus, are not intended to limit the present invention and the appended claims in any way.

What is claimed is:

1. A unit current cell of a differential wide gain range current digital-to-analog converter (DAC), comprising:
    a current source module, coupled to a current source voltage bias and a ground, that provides a unit current cell current that mirrors a current source bias current;
    a differential switch module coupled to the current source module;
    a main cascode module coupled to the differential switch module and a first bias voltage; and
    an attenuation cascode module coupled to the differential switch module and a second bias voltage,
    wherein the unit current cell current is routed to a main cascode output if the unit current cell current is at or above a current threshold to obtain an initial current gain range; and
    wherein the unit current cell current is routed to an attenuation cascode output and through a current attenuator if the unit current cell current is below the current threshold to obtain additional current gain range.

2. A differential wide gain range current digital-to-analog converter (DAC), comprising:
    at least one unit current cell having
        a first transistor having a source coupled to ground, a gate coupled to a current source voltage bias, and a drain;
        a second transistor having a source coupled to the first transistor drain, a gate coupled to a first switch signal, and a drain;
        a third transistor having a source coupled to the second transistor drain, a gate coupled to a first bias voltage, and a drain coupled to a first output;
        a fourth transistor having a source coupled to the second transistor drain, a gate coupled to a second bias voltage, and a drain coupled to a second output;
        a fifth transistor having a source coupled to the first transistor drain, a gate coupled to a second switch signal, and a drain;
        a sixth transistor having a source coupled to the fifth transistor drain, a gate coupled to the first bias voltage, and a drain coupled to a third output; and
        a seventh transistor having a source coupled to the fifth transistor drain, a gate coupled to a second bias voltage, and a drain coupled to a fourth output,
    wherein a unit current cell current is routed to one of the first and third outputs if the unit current cell current is at or above a current threshold to obtain an initial current gain range; and
    wherein the unit current cell current is routed to one of the second and fourth outputs if the unit current cell current is below the current threshold to obtain additional current gain range.

3. The current DAC of claim 2, wherein the first, second, third, fourth, fifth, sixth, and seventh transistors are NMOS transistors.

4. The current DAC of claim 2, wherein the first, second, third, fourth, fifth, sixth, and seventh transistors are PMOS transistors.

5. The current DAC of claim 2, wherein the first, second, third, fourth, fifth, sixth, and seventh transistors are bipolar transistors.

6. The current DAC of claim 2, wherein the first, second, and fifth transistors are thin oxide transistors.

7. The current DAC of claim 2, wherein the third, fourth, sixth, and seventh transistors are thick oxide transistors.

8. The current DAC of claim 2, wherein the first, second, third, fourth, fifth, sixth, and seventh transistors are thick oxide transistors.

9. The current DAC of claim 2, wherein the first, second, third, fourth, fifth, sixth, and seventh transistors are thin oxide transistors.

10. The current DAC of claim 2, wherein the third transistor has a larger width than the fourth transistor, and the sixth transistor has a larger width than the seventh transistor.

11. The current DAC of claim 2, further comprising a current attenuator having:
    a first input coupled to the unit current cell second output;
    a second input coupled to the unit current cell fourth output;
    a first current attenuator output;
    a second current attenuator output; and
    a control signal input.

12. The current DAC of claim 11, wherein the current attenuator comprises a plurality of attenuator cells.

13. The current DAC of claim 12, wherein each of the plurality of attenuator cells comprises:
    an eighth transistor having a source coupled to one of the unit current cell second and fourth outputs, a gate coupled to a voltage bias switch, and a drain coupled to a fifth output; and
    a ninth transistor having a source coupled to the eighth transistor source, a gate coupled to the voltage bias switch, and a drain coupled to a sixth output, wherein the sixth output is coupled to one of the first and second current attenuator outputs.

14. The current DAC of claim 13, wherein the eighth and ninth transistors are NMOS transistors.

15. The current DAC of claim 13, wherein the eighth and ninth transistors are thick oxide transistors.

16. The current DAC of claim 13, wherein the eighth and ninth transistors are thin oxide transistors.

17. The current DAC of claim 13, wherein only one of the eighth and ninth transistors is active at any given time, depending on a state of the voltage bias switch.

18. The current DAC of claim 17, wherein the voltage bias switch is coupled to the control signal input.

19. The current DAC of claim 18, wherein the voltage bias switch is controlled by a state of a control signal at the control signal input.

20. The current DAC of claim 19, wherein when the control signal is high, the voltage bias switch is set such that an input current from one of the unit current cell second and fourth outputs is routed to the fifth output.

21. The current DAC of claim 19, wherein when the control signal is low, the voltage bias switch is set such that an input current from one of the unit current cell second and fourth outputs is routed to the sixth output.

22. The current DAC of claim 18, wherein the plurality of attenuator cells comprises a plurality of attenuator subgroups.

23. The current DAC of claim 22, wherein one of the plurality of attenuator subgroups remains on, and the remaining attenuator subgroups of the plurality of attenuator subgroups are either on or off according to a control signal.

24. The current DAC of claim 23, wherein an incremental current gain is achieved for each of the attenuator subgroups turned on in their respective order.

25. The current DAC of claim 24, further comprising a current source that controls the current source voltage bias such that a desired current gain is obtained by programming the current source.

26. The current DAC of claim 24, wherein additional current gain is obtained in steps by programming the current source between a first current source setting and a second current source setting at each increment of each of the attenuator subgroups turned on in their respective order.

27. The current DAC of claim 26, wherein a step-size of the steps is linear.

28. The current DAC of claim 26, wherein the additional current gain is linear and a step-size of the steps is nonlinear.

29. The current DAC of claim 22, wherein the plurality of attenuator cells comprises thirty-two attenuator cells divided into six attenuator subgroups.

30. The current DAC of claim 29, wherein the plurality of attenuator cells comprises:
a first attenuator subgroup having sixteen attenuator cells;
a second attenuator subgroup having eight attenuator cells;
a third attenuator subgroup having four attenuator cells;
a fourth attenuator subgroup having two attenuator cells;
a fifth attenuator subgroup having one attenuator cell; and
a sixth attenuator subgroup having one attenuator cell.

31. The current DAC of claim 30, wherein the one attenuator cell of the sixth attenuator subgroup remains on.

32. The current DAC of claim 30, wherein the first, second, third, fourth, and fifth attenuator subgroups are controlled by a control signal at corresponding control signal inputs.

33. The current DAC of claim 32, wherein the control signal is a sequence of bits, with each bit corresponding to one of the first, second, third, fourth, and fifth attenuator subgroups.

34. The current DAC of claim 33, wherein each of the first, second, third, fourth, and fifth attenuator subgroups is turned on when its corresponding bit is a 1.

35. The current DAC of claim 33, wherein approximately −6 dB current gain is achieved for each of the first, second, third, fourth, and fifth attenuator subgroups turned on in their respective order, such that a total of approximately −30 dB current gain is achieved when all of the first, second, third, fourth, and fifth attenuator subgroups are on.

36. The current DAC of claim 35, further comprising a current source that controls the current source voltage bias such that up to approximately −30 dB of current gain is obtained by programming the current source.

37. The current DAC of claim 36, wherein the approximately −30 dB of current gain obtained from the current attenuator in conjunction with the approximately −30 dB of current gain obtained from programming the current source provides approximately −60 dB total current gain.

38. The current DAC of claim 36, wherein up to −60 dB of current gain is obtained in 0.5 dB steps by programming the current source between a first current source setting and a second current source setting at each increment of the first, second, third, fourth, and fifth attenuator subgroups turned on in their respective order.

39. A method of controlling current gain, comprising:
biasing at least one unit current cell with a current source bias voltage and current source bias current such that a unit current cell current is mirrored with the current source bias current;
determining whether the unit current cell current is at or above a current threshold;
routing the unit current cell current to a first current output if the unit current cell current is at or above the current threshold to obtain an initial current gain range; and
routing the unit current cell current to a second current output and through a current attenuator if the unit current cell current is below the current threshold to obtain an additional current gain range.

40. The method of claim 39, wherein the routing the unit current cell current to a second current output step comprises:
attenuating the unit current cell current to a desired current gain level.

41. The method of claim 40, wherein the attenuating step comprises:
attenuating the unit current cell current by a desired number of coarse incremental current gain steps to obtain the desired current gain level.

42. The method of claim 41, wherein the attenuating step further comprises:
changing the current source bias current in small incremental steps within the desired current gain level to obtain current gain control by fine incremental current gain steps that are smaller in size than the coarse incremental current gain steps.

43. The method of claim 40, further comprising programming the current attenuator for the desired current gain level.

44. The method of claim 43, wherein the programming step includes programming the current attenuator according to a control signal.

45. The method of claim 44, wherein the attenuating step comprises:
switching attenuator cells on or off according to the control signal.

46. The method of claim 45, wherein the switching step comprises:
switching each attenuator cell on or off according to a designated control bit of the control signal, the control signal containing one or more control bits.

47. The method of claim 45, wherein the switching step comprises:
switching subgroups of attenuator cells on or off according to a designated control bit of the control signal, the control signal containing one or more control bits, and the subgroups of attenuator cells being binary weighted to provide linear incremental current gain steps.

* * * * *